(12) United States Patent
Park et al.

(10) Patent No.: US 8,043,974 B2
(45) Date of Patent: Oct. 25, 2011

(54) SEMICONDUCTOR WET ETCHANT AND METHOD OF FORMING INTERCONNECTION STRUCTURE USING THE SAME

(75) Inventors: Jung-Dae Park, Anan-si (KR); Young You, Hwaseong-si (KR); Tae-Hyo Choi, Yongin-si (KR); Hun-Jung Yi, Suwon-si (KR); Kun-Hyung Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 777 days.

(21) Appl. No.: 12/168,952

(22) Filed: Jul. 8, 2008

(65) Prior Publication Data

US 2009/0017626 A1   Jan. 15, 2009

(30) Foreign Application Priority Data

Jul. 9, 2007   (KR) .................. 10-2007-0068569

(51) Int. Cl.
*H01L 21/302* (2006.01)

(52) U.S. Cl. ........ 438/747; 438/754; 438/756; 438/757; 216/105; 216/107; 216/109

(58) Field of Classification Search .................. 438/747, 438/754, 756, 757; 216/105, 107, 109
See application file for complete search history.

(56) References Cited

U.S. PATENT DOCUMENTS

| | | | |
|---|---|---|---|
| 2002/0063062 A1* | 5/2002 | Hymes .......................... | 205/123 |
| 2004/0035448 A1* | 2/2004 | Aegerter et al. ................ | 134/33 |
| 2005/0092349 A1 | 5/2005 | Suzuki et al. | |
| 2005/0217707 A1* | 10/2005 | Aegerter et al. ................ | 134/33 |
| 2006/0003596 A1* | 1/2006 | Fucsko et al. ................. | 438/758 |
| 2006/0170110 A1* | 8/2006 | Akram et al. ................. | 257/774 |

FOREIGN PATENT DOCUMENTS

| | | |
|---|---|---|
| JP | 2000-269178 | 9/2000 |
| JP | 2004-006618 | 1/2004 |

* cited by examiner

*Primary Examiner* — Binh X Tran
(74) *Attorney, Agent, or Firm* — Volentine & Whitt, PLLC

(57) ABSTRACT

A semiconductor wet etchant includes deionized water, a fluorine-based compound, an oxidizer and an inorganic salt. A concentration of the fluorine-based compound is 0.25 to 10.0 wt % based on a total weight of the etchant, a concentration of the oxidizer is 0.45 to 3.6 wt % based on a total weight of the etchant, and a concentration of the inorganic salt is 1.0 to 5.0 wt % based on a total weight of the etchant. The inorganic salt comprises at least one of an ammonium ion ($NH_4^+$) and a chlorine ion ($Cl^-$).

16 Claims, 8 Drawing Sheets

SEMICONDUCTOR WET ETCHANT AND METHOD OF FORMING INTERCONNECTION STRUCTURE USING THE SAME

PRIORITY CLAIM

A claim of priority is made to Korean Patent Application Serial No. 10-2007-0068569, filed Jul. 9, 2007, the disclosure of which is hereby incorporated herein by reference.

SUMMARY

Wet etchant solutions are utilized in the fabrication of semiconductor devices, such as in the formation of interconnection structures of semiconductor devices. For example, the fabrication of semiconductor devices typically includes a process in which an insulating layer and a conductive layer are formed on a semiconductor substrate, and then these layers are subjected to an etching process utilizing an etchant solution. In contrast to dry etchants, wet etchants are generally characterized by radiate etching capability over an entire surface of the semiconductor substrate.

Examples of the use of a protecting liquid and an etching liquid in a damascene process are disclosed in U.S. Pat. No. 6,683,007, issued in the name of Shinya Yamasaki et al.

In one non-limiting aspect of the present invention, a semiconductor wet etchant is provided which includes deionized water, and a fluorine-based compound, an oxidizer and an inorganic salt mixed in the deionized water. A concentration of the fluorine-based compound is 0.25 to 10.0 wt % based on a total weight of the etchant, a concentration of the oxidizer is 0.45 to 3.6 wt % based on a total weight of the etchant, and a concentration of the inorganic salt is 1.0 to 5.0 wt % based on a total weight of the etchant. The inorganic salt includes at least one of an ammonium ion ($NH_4^+$) and a chlorine ion ($Cl^-$).

In another non-limiting aspect of the present invention, a method of forming an interconnection structure is provided, which includes providing a semiconductor substrate having opposite main and back surfaces, and a side surface extending between the main surface to the back surface, forming a first insulating layer on the semiconductor substrate, wherein the first insulating layer is located over the main, back and side surfaces of the semiconductor substrate, and forming a second insulating over the first insulating layer, wherein the second insulating layer is located over the main and side surfaces of the semiconductor substrate. The method further includes sequentially forming first and second metal layers over second insulating layer, where the first metal layer is located over the main and side surfaces of the semiconductor substrate, and the second metal layer is located over the main surface of the semiconductor substrate, and performing a semiconductor wet etching process on the first metal layer and the first and second insulating layers. The semiconductor wet etching process is performed using a semiconductor wet etchant including a mixture of deionized water, a fluorine-based compound, an oxidizer and an inorganic salt. A concentration of the fluorine-based compound is 0.25 to 10.0 wt % based on a total weight of the etchant, a concentration of the oxidizer is 0.45 to 3.6 wt % based on a total weight of the etchant, and a concentration of the inorganic salt is 1.0 to 5.0 wt % based on a total weight of the etchant. The inorganic salt comprises at least one of an ammonium ion ($NH_4^+$) and a chlorine ion ($Cl^-$).

BRIEF DESCRIPTION OF THE DRAWINGS

The foregoing and other objects, features and advantages of the present invention will become more apparent from the detailed description that follows, with reference to the accompanying drawings. The drawings are not necessarily to scale, with emphasis instead being placed upon illustrating principles of embodiments of the present invention.

DETAILED DESCRIPTION OF EMBODIMENT

Figure 1:
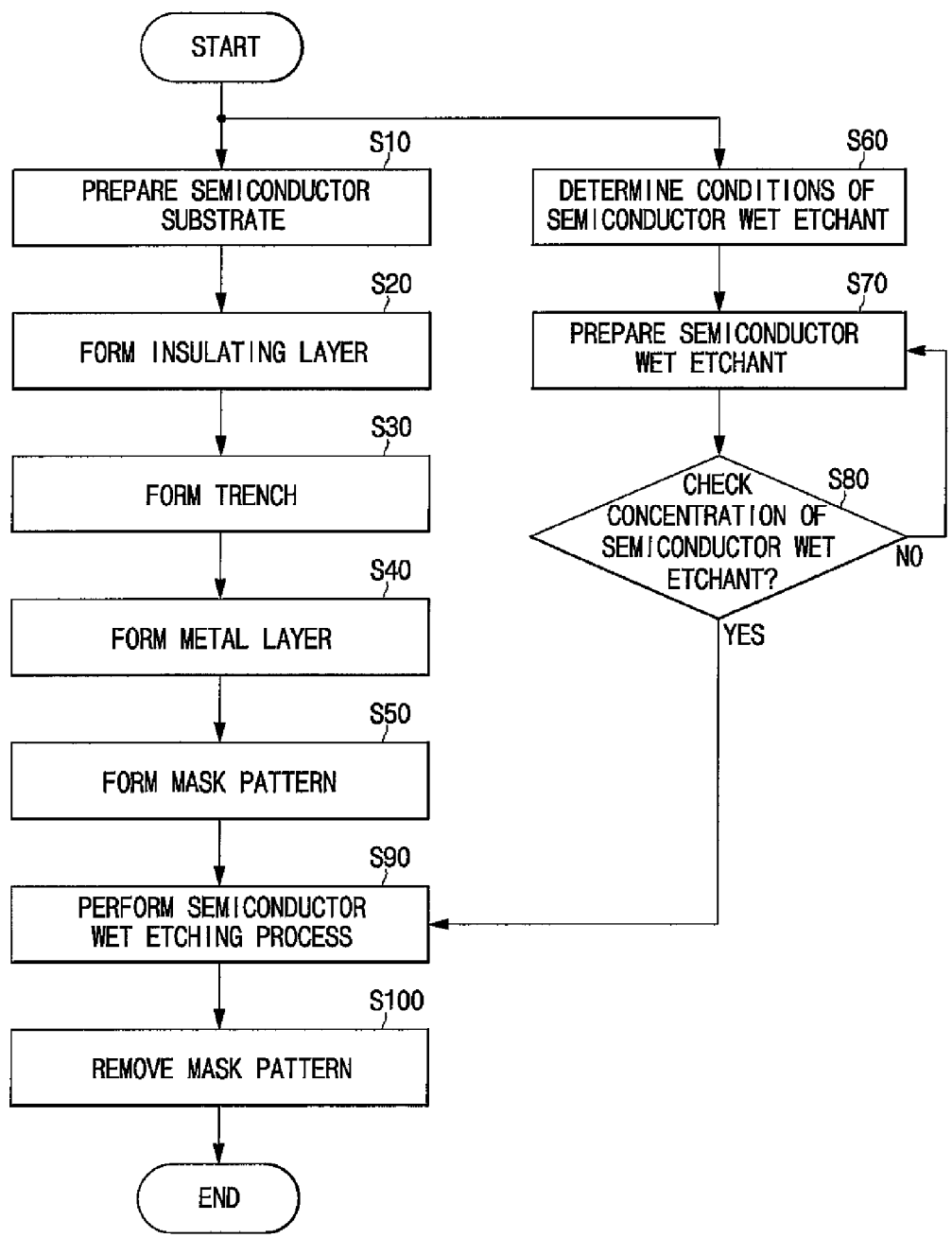
FIG. 1 is a flowchart of a semiconductor damascene process according to an embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Although the terms "selected," "different", "predetermined", "part" and "the rest" may be used to denote several elements herein, it may be understood that the elements are not limited to these terms. These terms only used to distinguish one element from another element. For example, without departing from a scope of the invention, a first metal layer may be named to a second metal layer, and the second metal layer may be named to the first metal layer. Here, as used herein, a term "and/or" includes all combinations which can be inferred from listed items having at least one relationship. Particularly relative terms such as "outer, upper, more, gradually and on" may be used to make a simple description for a relative relationship between other element and one figure or a figure illustrated in the drawings. Moreover, technical terms used herein are not used to define the invention but to simply describe specific aspects.

A semiconductor wet etchant and a method of forming an interconnection structure using the same according to embodiments of the present invention will now be described in detail with reference to accompanying drawings.

Figure 2:
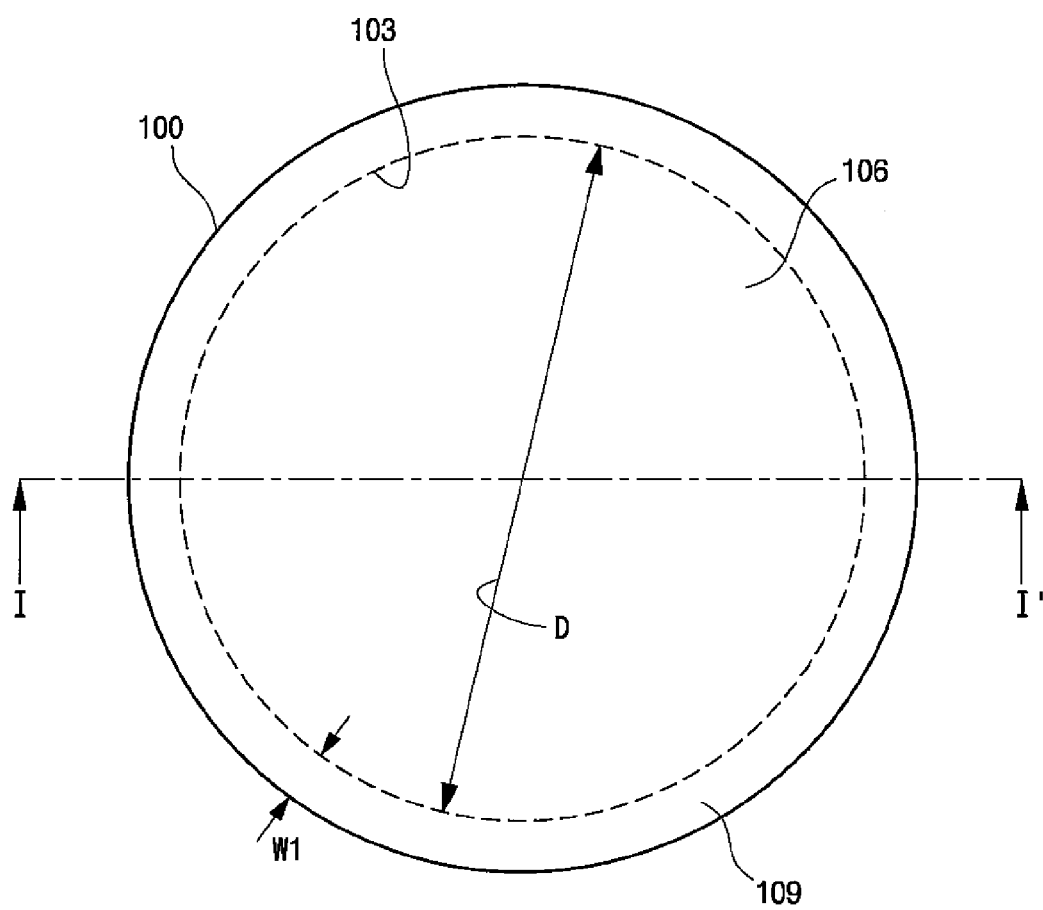
FIG. 2 is a plan view of a semiconductor substrate which may be utilized in the process of FIG. 1 according to an embodiment of the present invention.

FIG. 1 is a flowchart of a semiconductor damascene process according to an embodiment of the present invention, and FIG. 2 is a plan view showing a semiconductor substrate which may be utilized in the process of FIG. 1.

In step S10 of FIG. 1, at least one semiconductor substrate 100 is be prepared as shown by way of example in FIG. 2. The semiconductor substrate 100 of this example includes a main surface, a back surface and a side surface. The main and back surfaces of the semiconductor substrate 100 are disposed parallel and opposite to each other, and the side surface of the semiconductor substrate 100 extends between the main and back surfaces of the semiconductor substrate 100.

The main surface of the semiconductor substrate 100 of this example includes a device-forming region 106 and a device-excluding region 109 which surrounds the device-forming region 106. The device forming region 106 and the device excluding region 109 contact each other in this example with a region-dividing line 103 defined therebetween. In FIG. 2, the device-forming region 106 is shown as having a predetermined diameter D, and the device-excluding region 109 is shown as having a width W1.

Figure 3:
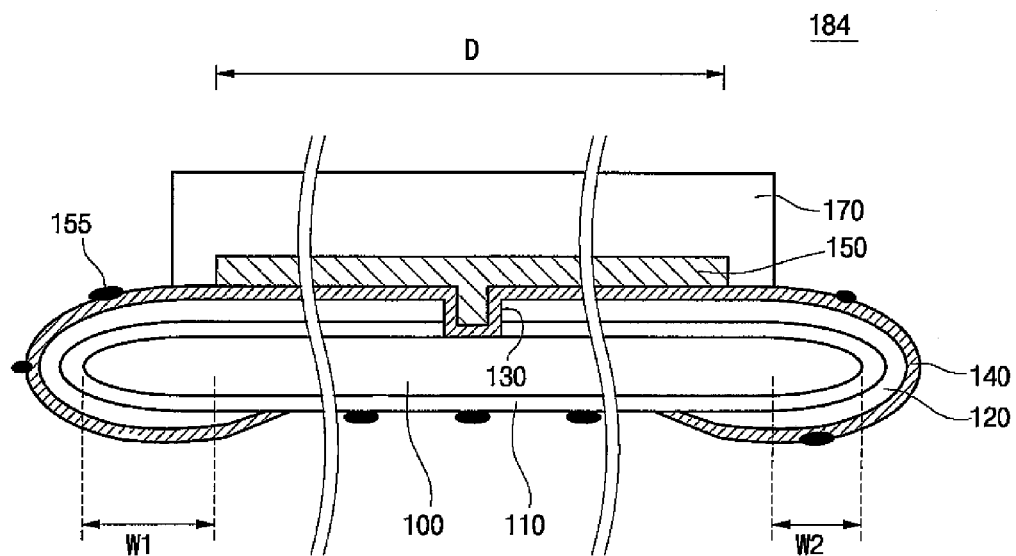
FIG. 3 is a cross-sectional view showing a first interconnection forming structure taken along line I-I' of FIG. 2 after a semiconductor damascene process of FIG. 1 is partially performed.
Figure 4:
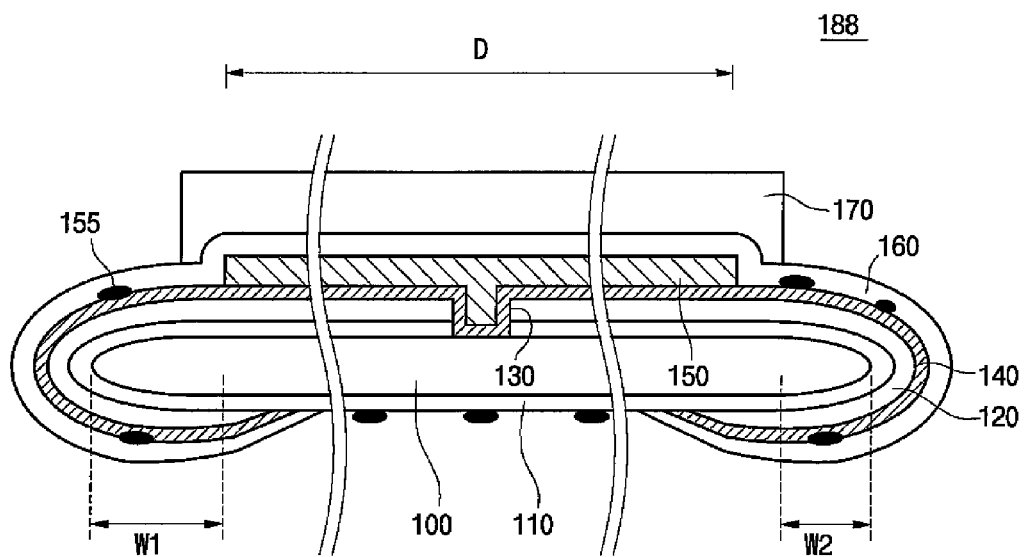
FIG. 4 is a cross-sectional view showing a second interconnection forming structure taken along line I-I' of FIG. 2 after a semiconductor damascene process of FIG. 1 is partially performed.

FIG. 3 is a cross-sectional view showing a first interconnection forming structure taken along line I-I' of FIG. 2 after a semiconductor damascene process of FIG. 1 is partially performed. FIG. 4 is a cross-sectional view showing a second interconnection forming structure taken along line I-I' of FIG. 2 after the semiconductor damascene process of FIG. 1 is further partially performed.

Referring collectively to FIGS. 1, 3 and 4, in step S20 of FIG. 1, first and second insulating layers 110 and 120 are sequentially formed on the semiconductor substrate 100. The first and second insulating layers 110 and 120 may, for example, be a silicon nitride layer and a silicon oxide layer, respectively.

The first insulating layer 110 may be formed on the main, back and side surfaces of the semiconductor substrate 100. To this end, the first insulating layer 110 may be formed using a semiconductor diffusion tube.

The second insulating layer 120 may be formed on the main and side surfaces of the semiconductor substrate 100 to cover the first insulating layer 110. To this end, the second insulating layer 120 may be formed by a plasma enhanced chemical vapor deposition (PECVD) technique.

As mentioned above, the first insulating layer 110 may be formed of a silicon nitride layer, and the second insulating layer 120 may be formed of silicon oxide. However, the embodiment is not limited in this respect. As other examples, the first insulating layer 110 may be formed of at least one stack of a silicon oxide layer and a silicon nitride layer, where the silicon nitride layer constitutes an uppermost portion of the first insulating layer 110, and the second insulating layer 120 may be formed of a silicon oxide layer and a silicon nitride layer, which are sequentially stacked by a semiconductor diffusion tube, a PECVD technique or a combination thereof. In this example, the silicon oxide layer in the first insulating layer 110 may have a dielectric coefficient ranging from 3.0 to 4.5, and the silicon oxide layer in the second insulating layer 120 may have a dielectric coefficient ranging from 2.0 to 3.0.

In step S30 of FIG. 1, at least one trench 130 is formed in the first and second insulating layers 110 and 120, as shown in FIGS. 3 and 4. The trench 130 may be formed to expose the semiconductor substrate 110 through the first and second insulating layers 110 and 120 while the semiconductor damascene process is being performed. The trench 130 of this example is disposed in the device-forming region 106 (FIG. 2). The trench 130 may instead be disposed in the device-excluding region 109 (FIG. 2).

In step S40 of FIG. 1, a first metal layer 140 is formed on the second insulating layer 120 to conformally cover the trench 130 as shown in FIGS. 3 and 4. The first metal layer 140 may be disposed on the main and side surfaces of the semiconductor substrate 100. As an example, the first metal layer 140 is formed of a diffusion barrier layer and a copper seed layer, which are sequentially stacked. The diffusion barrier layer may prevent diffusion of copper atoms in the copper seed layer into the first and second insulating layers 110 and 120 and the semiconductor substrate 100. As examples, the diffusion barrier layer may be formed of metal, metal nitride or combinations thereof, such as titanium (Ti), titanium nitride (TiN), tantalum (Ta), tantalum nitride (TaN) or a combination thereof.

Referring again to FIGS. 1, 3 and 4, in step S40 of FIG. 1, a second metal layer 150 is formed on the first metal layer 140 to fill the trench 130 as shown in FIGS. 3 and 4. The second metal layer 150 may, for example, be formed by an electroplating technique, and may, for example, be formed of copper or a combination material including the copper. In this example, the second metal layer 150 is formed only on the main surface of the semiconductor substrate 100, or more specifically, only on the device-forming region 106 (FIG. 2) of the substrate 100.

Formation of the second metal layer 150 may result in the formation of second metal layer residues 155 due to characteristics of the electroplating process. Such second metal layer residues 155 may be formed in the peripheral region of the main surface of the semiconductor substrate 100, and on the side and back surfaces of the semiconductor substrate 100 as shown in FIGS. 3 and 4.

Referring to FIG. 3, in step S50 of FIG. 1, a mask pattern 170 is formed on the first and second metal layers 140 and 150. In this example, the mask pattern 170 to cover the second metal layer 150 and an adjacent portion of the first metal layer 140, which exposing the second metal layer residues 155. Accordingly, the structure illustrated in FIG. 3 constitutes an interconnection forming structure 184.

The interconnection forming structure 188 of FIG. 4 differs from that of FIG. 3 in that a third insulating layer 160 is formed on the first and second metal layers 140 and 150, and prior to formation of the mask pattern 170. The third insulating layer 160 may, for example, be a silicon oxide layer or a silicon nitride layer. As another example, the third insulating layer 160 may be formed of at least one stack of a silicon oxide layer and a silicon nitride layer. Here, the third insulating layer 160 may be formed by a semiconductor diffusion tube, a PECVD technique or a combination thereof. The silicon oxide layer in the third insulating layer 160 may have a dielectric coefficient ranging from 2.0 to 3.0.

The mask pattern 170 may, for example, be formed of photoresist or poly silicon. The mask pattern 170 may be formed to be spaced a predetermined width W2 from the side surface of the semiconductor substrate 100, and may partially overlap the device-excluding region 109 of FIG. 2 (i.e., W2 may be less than W1).

A method of forming a semiconductor wet etchant (steps S60, S70 and S80) according to embodiments of the present invention will now be described with reference to the graphs of FIGS. 9 to 11. The semiconductor wet etchant is a solution which may reduce a copper concentration in the semiconductor substrate when etching the first interconnection forming structure 184 of FIG. 3 or the second interconnection forming structure 188 of FIG. 4.

Figure 9:
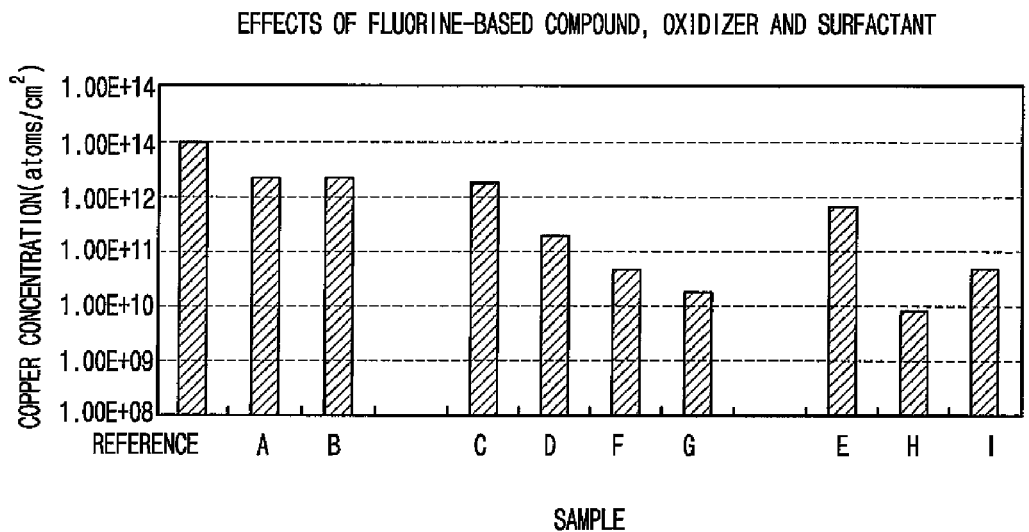
FIGS. 9 to 11 are graphs for use in describing a method of forming a semiconductor wet etchant according to embodiments of the present invention.

Referring to FIGS. 1 and 9, in step S60 of FIG. 1, deionized water and chemical materials were prepared in order to form a semiconductor wet etchant. The chemical materials may include a fluorine-based compound, an oxidizer, an inorganic salt and a surfactant. Several kinds of solutions were prepared by mixing the chemical materials with the deionized water. In order to test the solutions, several first interconnection forming structures 184 as shown in FIG. 3 were prepared.

The respective solutions were applied to the first respective interconnection forming structures 184 rotating at 1500 rpm/60 (sec.) for 10 to 120 seconds in a single-type semiconductor wet etching apparatus. Here, the respective first interconnection forming structures 184 may be disposed on a substrate chuck of the single-type semiconductor wet etching equipment and rotated together with the substrate chuck thereof. Subsequently, the respective first interconnection forming structures 184 were rinsed with the deionized water while rotating at 1500 rpm/25 (sec.) in the single-type semiconductor wet etching equipment, and then dried with nitrogen gas while rotating at 2500 rpm/30 (sec.). Here, the respective solutions were applied only to the side and back surfaces of the respective first interconnection forming structures 184. The main surface of the respective first interconnection forming structure 184 was surrounded by a protection layer during the application of the respective solutions.

The protection layer may be formed, for example, of an inert gas, nitrogen gas or deionized water. Here, the main, side and back surfaces of the respective first interconnection forming structures 184 correspond to the main, side and back surfaces of the semiconductor substrate 100. The respective solutions were sequentially applied to the first metal layer 140, and the first and second insulating layers 110 and 120 until the side and back surfaces of the semiconductor substrate 100 of FIG. 3 were exposed. After that, a copper concentration of each of the first interconnection forming structures 184 was measured by a vapor phase decomposition (VPD) induced couple plasma (ICP)-mass spectroscopy (MS). Weight percent (wt %) of the chemical materials in the respective solutions and copper concentrations (atoms/cm$^2$) in the respective first interconnection forming structures 184 corresponding to the respective solutions are listed in Table 1.

reference sample. This is because samples A and B do not have a first metal layer 140, and first and second insulating layers 110 and 120, which are disposed on side and back surfaces of the samples A and B.

More specifically, the first metal layer 140, and the first and second insulating layers 110 and 120 were removed from the side and back surfaces of the samples A and B by solutions respectively having hydrogen fluoride (HF) concentrations of 0.25 and 10.0 wt %. Thus, samples A and B, unlike the reference sample, do not have second metal layer residues 155 on the first metal layer 140. Accordingly, the samples A and B may have lower copper concentrations than the reference sample. However, copper concentrations were not different between samples A and B even though the hydrogen fluoride (HF) concentrations in the solutions were different from each other, for example, 0.25 and 10.0 wt %.

As shown in FIG. 9, the copper concentrations of samples C, D, F and G are gradually decreased in order, as a hydrogen fluoride (HF) concentration of solutions having the same hydrogen peroxide ($H_2O_2$) concentration of 0.45 wt % is increased from 2.5 to 10.0 wt %. This is because the solutions have the same oxidation degree with respect to the second metal layer residues 155 and a high etch rate with respect to the first metal layer 140 and the first and second insulating layers 110 and 120 on the side and back surfaces of the samples C, D, F and G by increasing the hydrogen fluoride (HF) concentration.

Since the solutions applied to the samples C, D, F and G have oxidizing power, they may reduce copper concentrations when compared with the solutions applied to samples A and B of FIG. 9. Moreover, in FIG. 9, a difference in copper concentration exists between samples C and D among solutions which have the same hydrogen fluoride (HF) and hydrogen peroxide ($H_2O_2$) concentrations, but different surfactant concentrations. The surfactant may, for example, be a non-

TABLE 1

| | Solution | | | | | Copper |
|---|---|---|---|---|---|---|
| Sample | Fluorine-based compound (wt %) | Oxidizer (wt %) | Inorganic salt (wt %) | Surfactant (ppm) | Deionized water (wt %) | Concentration (atoms/cm2) |
| Reference | — | — | — | — | — | 1.0E13 |
| A | HF(0.25) | — | — | — | DI(99.75) | 2.25E12 |
| B | HF(10.0) | — | — | — | DI(90.00) | 2.25E12 |
| C | HF(2.5) | $H_2O_2$(0.45) | — | — | DI(97.05) | 1.61E12 |
| D | HF(2.5) | $H_2O_2$(0.45) | — | 50 | DI(97.05) | 1.71E11 |
| E | HF(2.5) | $H_2O_2$(3.6) | — | 50 | DI(93.90) | 6.52E11 |
| F | HF(5.0) | $H_2O_2$(0.45) | — | 50 | DI(94.55) | 4.51E10 |
| G | HF(10.0) | $H_2O_2$(0.45) | — | 50 | DI(89.55) | 1.71E10 |
| H | HF(10.0) | $H_2O_2$(3.6) | — | — | DI(86.40) | 0.80E10 |
| I | HF(10.0) | $H_2O_2$(3.6) | — | 50 | DI(86.40) | 4.81E10 |
| J | TMAF(10.0) | $H_2O_2$(3.6) | — | — | DI(86.40) | 1.41E11 |
| K | TMAF(10.0) | $H_2O_2$(3.6) | — | 50 | DI(86.40) | 2.42E11 |
| L | HF(10.0) | $HNO_3$(3.6) | — | — | DI(86.40) | 0.10E10 |
| M | HF(10.0) | $HNO_3$(3.6) | — | 50 | DI(86.40) | 0.24E10 |
| N | HF(10.0) | $H_2O_2$(3.6) | $NH_4Cl$(5.0) | — | DI(81.40) | 0.24E10 |
| O | HF(10.0) | $H_2O_2$(3.6) | HCl(1.0) | — | DI(85.40) | 0.18E10 |
| P | HF(10.0) | $H_2O_2$(3.6) | $NH_4Cl$(5.0) | 50 | DI(81.40) | 0.33E10 |
| Q | HF(10.0) | $H_2O_2$(3.6) | HCl(1.0) | 50 | DI(85.40) | 0.15E10 |
| R | HF(10.0) | $H_2O_2$(3.6) | $(NH_4)_2CO_3$(5.0) | 50 | DI(81.40) | 1.01E10 |
| S | HF(10.0) | $H_2O_2$(3.6) | $NH_4Br$(5.0) | 50 | DI(81.40) | 0.51E10 |

Herein, a reference sample is a first interconnection forming structure to which any solution is not applied.

First, an experimental record of selecting a semiconductor wet etchant from among the solutions will be described with reference to Table 1 and FIG. 9. As shown in FIG. 9, samples A and B in Table 1 have lower copper concentrations than the ionized surfactant which is composed of a copolymer of ethylene and propylene. The surfactant prevents re-adsorption of the second metal layer residues 155, which have been removed with the first metal layer 140, to the semiconductor substrate 100.

Also, as shown in FIG. 9, copper concentrations of samples E, H and I seem to gradually decrease a little, as the hydrogen fluoride (HF) concentrations of solutions having the same hydrogen peroxide ($H_2O_2$) concentration of 3.6 wt % increase from 2.5 to 10.0 wt %. The copper concentrations have no large difference among the samples E, H and I according to whether the respective solutions include a surfactant therein. The surfactant increases the copper concentrations in order along the samples H and I in the solutions having a HF concentration of 10.0 wt %.

However, as seen in Table 1 and FIG. 9, solution applied to sample I may further decrease the copper concentrations than the solutions applied to samples A and B.

Figure 10:
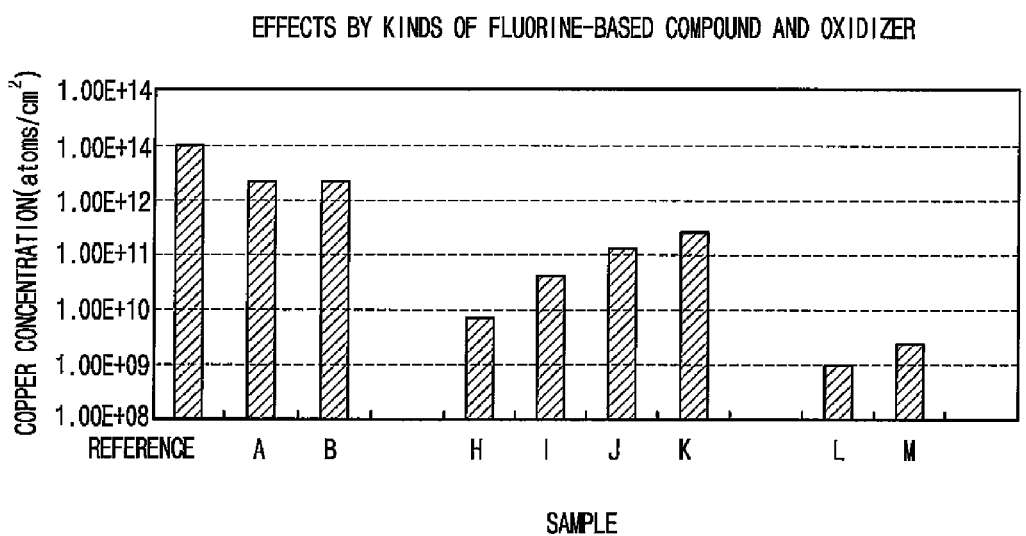

A description of the experimental record of selecting the semiconductor wet etchant according to embodiments of the present invention from among the solutions will be continued with reference to Table 1 and FIG. 10.

Referring to Table 1 and FIG. 10, in step S60 of FIG. 1, samples A and B of FIG. 10 are the first interconnection forming structures 184 of FIG. 3 which are treated with solutions having hydrogen fluoride (HF) concentrations of 0.25 and 10.0 wt % along Table 1, respectively, similarly to that described in FIG. 9. Also, FIG. 10 shows that samples H, I, J and K of Table 1 have smaller copper concentrations than the samples A and B. More particularly, FIG. 10 shows that the copper concentrations of the samples H, I, J and K are gradually increased as the solutions have the same hydrogen peroxide ($H_2O_2$) and fluorine-based compound of 3.6 and 10.0 wt %, and have different kinds of fluorine-based compounds as shown in Table 1. The solutions include hydrogen fluoride (HF) or tetra-methyl ammonium fluoride (TMAF; $(CH_3)_4NF$) as a fluorine-based compound.

A solution having tetra-methyl ammonium fluoride (TMAF; $(CH_3)_4NF$) has a generally low etch rate with respect to the first metal layer 140, and the first and second insulating layers 110 and 120 of FIG. 3 in comparison with a solution having hydrogen fluoride (HF). Accordingly, the solution having tetra-methyl ammonium fluoride (TMAF; $(CH_3)_4NF$) has higher copper concentrations in samples J and K than the solution having hydrogen fluoride (HF) in FIG. 10. Surfactants applied to the samples H, I, J and K gradually increase the copper concentration when used with the solutions having a fluorine-based compound (HF or TMAF) concentration of 10.0 wt %, similarly to FIG. 9. The fluorine-based compound may be at least one of ammonium fluoride ($NH_4F$), ammonium bifluoride ($NH_4HF_2$) and tetra-butyl ammonium fluoride (TBMA; $(CH_3CH_2CH_2CH_2)_4NF$).

As shown in FIG. 10, samples L and M of Table 1 have lower copper concentrations than samples H, I, J and K. This is because samples L and M are treated with a solution having a HF concentration of 10.0 wt % and a nitric acid ($HNO_3$) concentration of 3.6 wt %. That is, the solution having hydrogen fluoride (HF) and nitric acid ($HNO_3$) has a generally high etch rate with respect to the first metal layer 140 and the first and second insulating layers 110 and 120 of FIG. 3 In comparison with a solution having hydrogen fluoride (HF) and hydrogen peroxide ($H_2O_2$). Here, surfactant applied to the samples L and M increase the copper concentrations when used with the solution having a fluorine-based compound (HF) concentration of 10.0 wt %, similarly to FIG. 9. The nitric acid as an oxidizer may, for example, be substituted by at least one of sulphuric acid ($H_2SO_4$), ammonium nitrate ($NH_4NO_3$), ammonium iodate ($NH_4IO_3$) and ammonium disulfate (($NH_4)_2S_2O_5$).

As seen in Table 1 and FIG. 10, the solutions applied to samples H, I, J, K, L and M may further decrease the copper concentrations than the solutions applied to the sample A and B.

Finally, the experimental record of selecting the semiconductor wet etchant according to embodiments of the present invention from among the solutions will be subsequently described with reference to Table 1 and FIG. 11.

Figure 11:
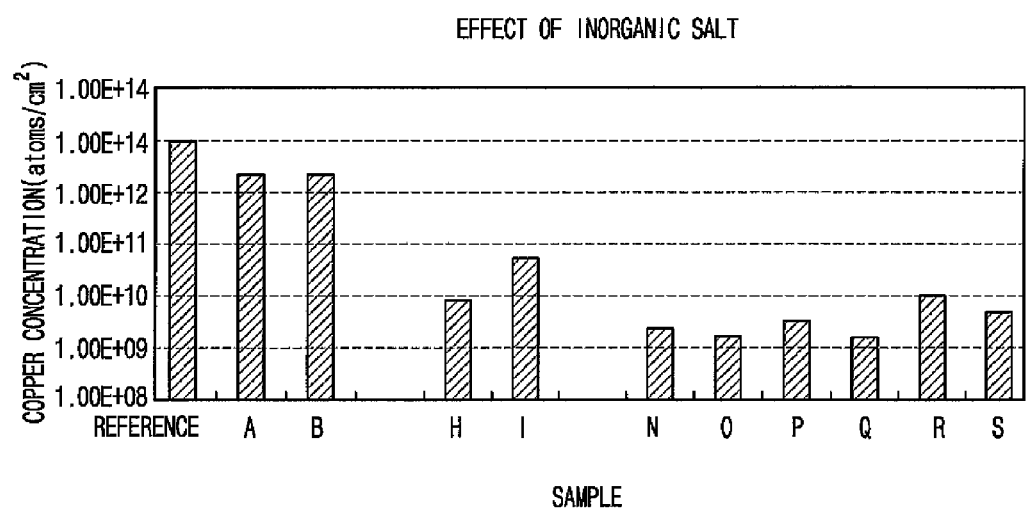

Referring to Table 1 and FIG. 11, in step S60 of FIG. 1 according to the present invention, samples A and B of FIG. 11, similarly to that described in FIG. 9, are the first interconnection forming structures 184 of FIG. 3 which are treated with the solutions having hydrogen fluoride (HF) concentrations of 0.25 and 10.0 wt %, respectively. Moreover, in Table 1, solutions applied to samples H and I do not include an inorganic salt. The solutions applied to the samples H and I include a fluorine-based compound and an oxidizer, wherein sample I further includes a surfactant. Also, samples N, O, P, Q, R and S of Table 1 were treated with solutions that have 10.0 wt % hydrogen fluoride (HF) and 3.6 wt % hydrogen peroxide ($H_2O_2$), and different kinds of inorganic salts from one another. Here, samples N and O were treated with solutions that do not include a surfactant, and samples P, Q, R and S were treated with solutions that include a surfactant.

The inorganic salts include ammonium chloride ($NH_4Cl$), hydrochloric acid (HCl), ammonium carbonate (($NH_4)_2CO_3$) and ammonium bromide ($NH_4Br$). As shown in FIG. 11, the solutions applied to samples N, O, P, Q, R and S have lower copper concentrations than those applied to samples H and I. More particularly, solutions having inorganic salts such as ammonium chloride ($NH_4Cl$) and hydrochloric acid (HCl) have lower copper concentrations than those having the inorganic salts such as ammonium carbonate (($NH_4)_2CO_3$) and $NH_4Br$. This is because the solutions having inorganic salts such as ammonium chloride ($NH_4Cl$) and hydrochloric acid (HCl) detach the first metal layer 140 and the second metal layer residues 155 of FIG. 3 from the first and second insulating layers 110 and 120 using hydrogen fluoride (HF), and allow copper atoms in the first and second metal layers 140 and 150 to react with chlorine ion ($Cl^-$). Solutions having inorganic salt such as ammonium chloride ($NH_4Cl$) may allow the copper atoms in the first and second metal layers 140 and 150 to react with the chlorine ion ($Cl^-$) in accordance with the following representative chemical reaction formula.

Formula 1

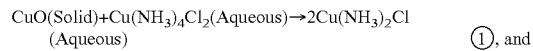

①, and

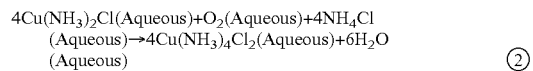

②

More specifically, in ① of Formula 1, 'CuO (solid)' is referred to as a copper layer oxidized in the solution by an oxidizer. Further, '$Cu(NH_3)_4Cl_2$ (Aqueous)' is referred to a copper atom dissolved in the solution. CuO reacts with $Cu(NH_3)_4Cl_2$, thereby generating by-products, '$2Cu(NH_3)_2Cl$', in the solution. In ② of Formula 1, '$4Cu(NH_3)_2Cl$' reacts with oxygen '$O_2$' of deionized water and an inorganic salt '$4NH_4Cl$', thereby generating by-products, '$4Cu(NH_3)_2Cl$ and $6H_2O$' in the solution. '$4Cu(NH_3)_2Cl$ and $6H_2O$' may be discharged from the semiconductor wet equipment along with the solution.

The solutions having inorganic salts such as ($NH_4)_2CO_3$ and $NH_4Br$ exhibit favorable properties in dissolving the copper atoms in the first and second metal layers 140 and 150 as compared to the solutions applied to samples H and I. According to Table 1 and FIG. 11, the solutions applied to the samples N, O, P, Q, R and S may further reduce copper concentrations relative to the solutions applied to samples H and I. The inorganic salt may, for example, be at least one of ammonium ion ($NH_4^+$) and chlorine ion ($Cl^-$). Moreover, the inorganic salt may be one selected from non-metal atoms bonded to the ammonium ion ($NH_4^+$) and/or one selected from metal atoms bonded to the chlorine ion ($Cl^-$). Here, the non-metal atoms may include chlorine (Cl), bromine (Br), iodine (I) and carbonic acid ($CO_3$), and the metal atoms may include sodium (Na), kalium (K), calcium (Ca) and cesium (Cs).

Consequently, the semiconductor wet etchant of embodiments of the present invention may be obtained from solutions having 0.25~10.0 wt % fluorine-based compound, 0.45~3.6 wt % oxidizer, and 1.0~5.0 wt % inorganic salt in deionized water. The semiconductor wet etchant may be applied to the first interconnection forming structure 184 shown in FIG. 3 to obtain a copper concentration of 0.6E10 (atoms/cm²) or less. Further, the surfactant applied to the samples N, O, P, Q, R and S seem to not largely influence on copper concentrations.

In step S70 of FIG. 1, 0.25~10.0 wt % fluorine-based compound, 0.45~3.6 wt % oxidizer, and 1.0~5.0 wt % inorganic salt are mixed with the deionized water to form a solution as the semiconductor wet etchant. Here, a surfactant may be mixed with the deionized water. When the surfactant is mixed with the deionized water, the surfactant may have a tolerance from the amount (50 ppm) shown in Table 1.

After the formation of the solution, in step S80 of FIG. 1, concentrations of the fluorine-based compound, the oxidizer and the inorganic salt in the solution may be measured by various known methods. Here, if the solution does not satisfy the above conditions of the semiconductor wet etchant, the solution is discarded, and the process goes back to step S70 of FIG. 1 to again prepare other solution as the semiconductor wet etchant. On the contrary, if the solution satisfies the above conditions of the semiconductor wet etchant, the solution may be applied to the first interconnection forming structure 184 of FIG. 3 or the second interconnection forming structure 188 of FIG. 4.

Figure 5:
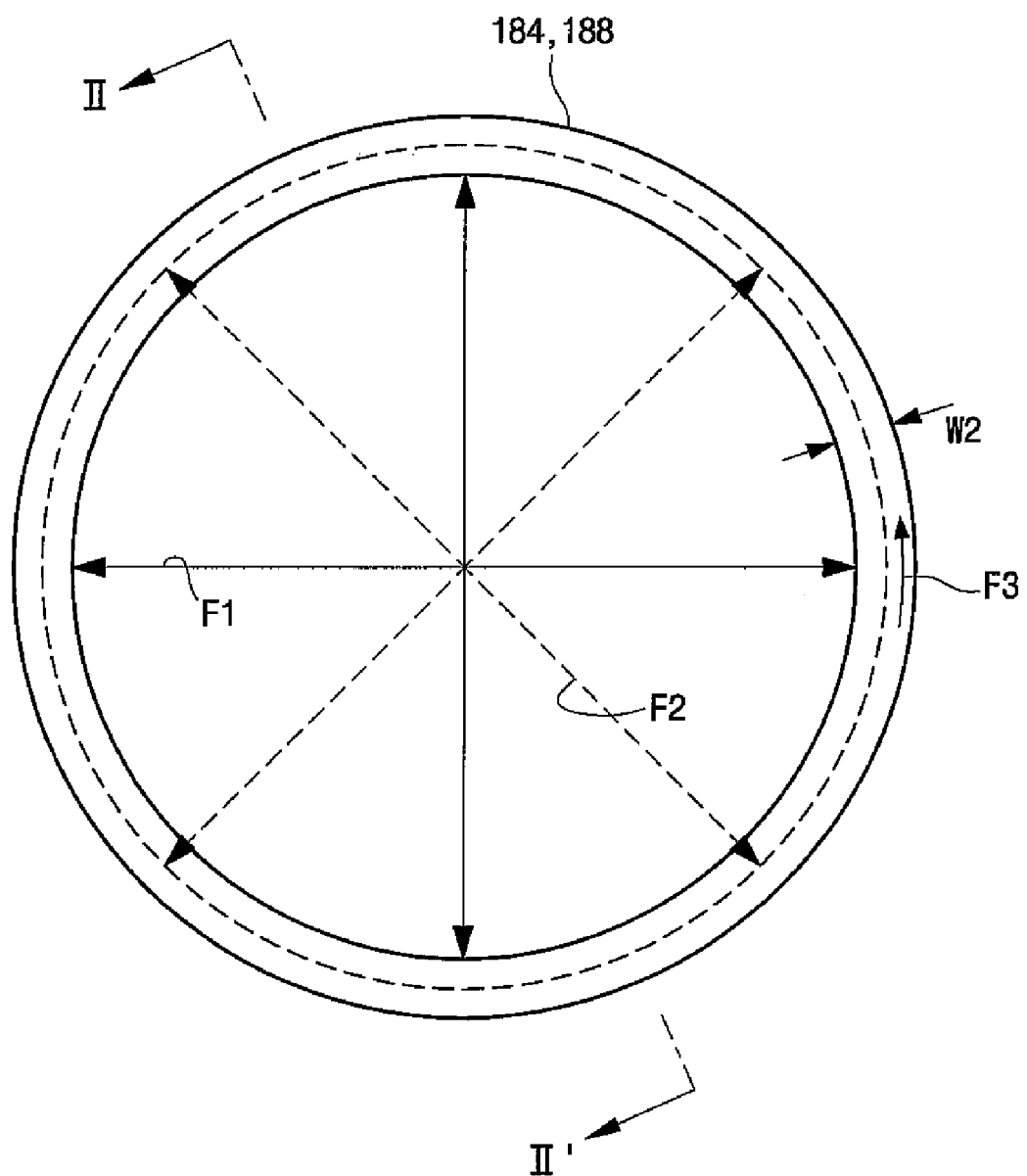
FIGS. 5 and 6 are a plan view and a cross-sectional view, respectively, for use in describing a method of applying a semiconductor wet etchant to the first and second interconnection forming structures of FIGS. 3 and 4.
Figure 6:
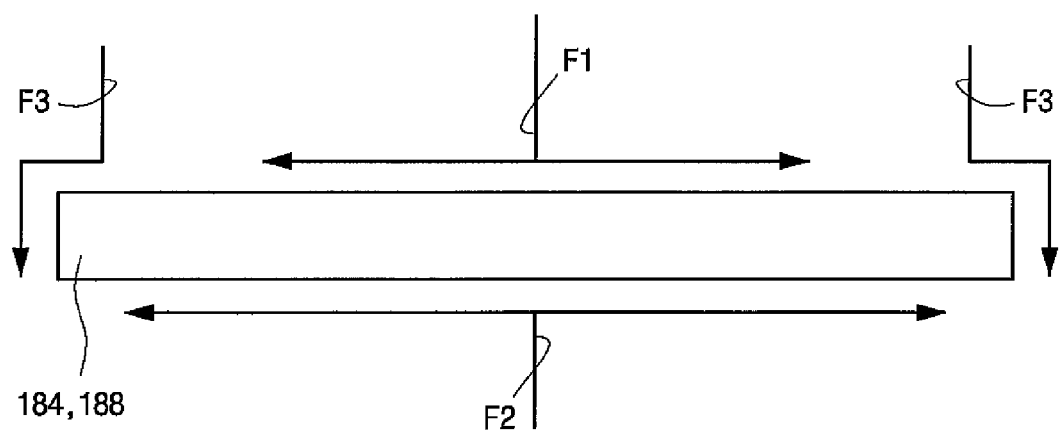

FIGS. 5 and 6 are a plan view and a cross-sectional view illustrating a method of applying a semiconductor wet etchant to first and second interconnection forming structures of FIGS. 3 and 4, respectively.

Referring to FIGS. 1, and 3 to 6, in step S90 of FIG. 1, the semiconductor wet etchant is applied to the first interconnection forming structure 184 of FIG. 3 or the second interconnection forming structure 188 of FIG. 4. The semiconductor wet etchant is a solution in which 0.25 to 10.0 wt % fluorine-based compound, 0.45 to 3.6 wt % oxidizer and 1.0 to 5.0 wt % inorganic salt are mixed with the deionized water. The semiconductor wet etchant may be applied to back and side surfaces of the first interconnection forming structure 184 or the second interconnection forming structure 188 along lines F2 and F3 as shown in FIG. 5 or 6. The semiconductor wet etchant may be used in a single-type semiconductor wet etching equipment. The semiconductor wet etching equipment may rotate the first interconnection structure 184 or the second interconnection structure 188 at 1500 rpm/60 (sec.) while spraying the semiconductor wet etchant.

The semiconductor wet etching equipment may form a protection layer covering a main surface of the first interconnection forming structure 184 or the second interconnection forming structure 188 along a line F1 of FIG. 5 or 6. The protection layer may be an inert gas, a nitrogen gas or a deionized water. The protection layer functions such that the semiconductor wet etchant is not in contact with the second metal layer 150, which is disposed on the main surface of the first interconnection forming structure 184 or the second interconnection forming structure 188 of FIGS. 3 and 4. When the first and second interconnection forming structures 184 and 188 have the mask pattern 170, the protection layer may not be formed on the main surfaces of the first and second interconnection forming structures 184 and 188. This is because the mask pattern 170 covers the second metal layer 150, which is disposed on the main surface of the first or second interconnection forming structure 184 or 188.

The semiconductor wet etching equipment may spray the semiconductor wet etchant on the back surface of the first or second interconnection forming structure 184 or 188 along the line F2 of FIG. 5 or 6. Moreover, the semiconductor wet etching equipment may spray the semiconductor wet etchant along the line F3 of FIG. 5 or 6 to occupy an area from the side surface to the main surface, or from the main surface to the side surface of the first or second interconnection forming structure 184 or 188 by a predetermined width W2. Accordingly, the semiconductor wet etchant sprayed along the line F3 contacts the main and side surfaces of the first or second interconnection forming structure 184 or 188. The semiconductor wet etching equipment may simultaneously or sequentially spray the semiconductor wet etchant along the lines F2 and F3. After that, the first or second interconnection forming structure 184 or 188 is rinsed with the deionized water while rotating at 1500 rpm/25 (sec.) in the single-type semiconductor wet etching equipment, and then dried using nitrogen gas while rotating at 2500 rpm/30 (sec.).

Figure 7:
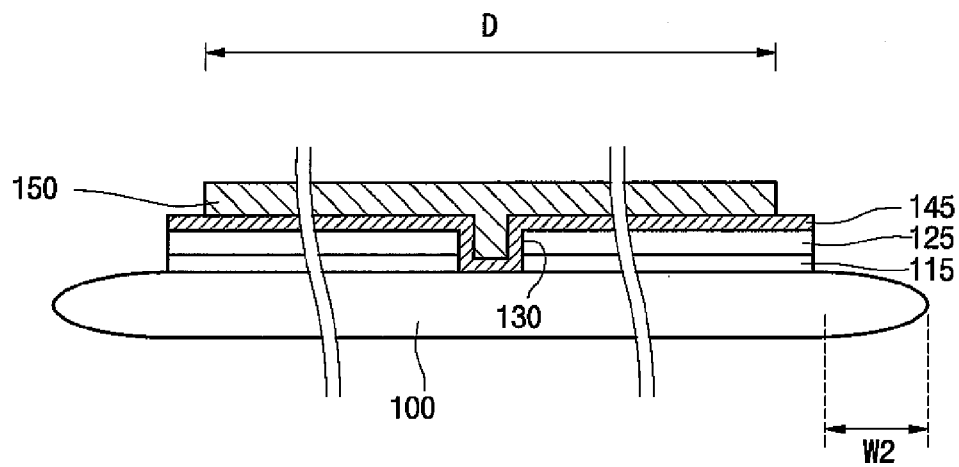
FIG. 7 is a cross-sectional view showing the first interconnection structure after applying a semiconductor wet etchant to the first interconnection forming structure of FIG. 3.
Figure 8:
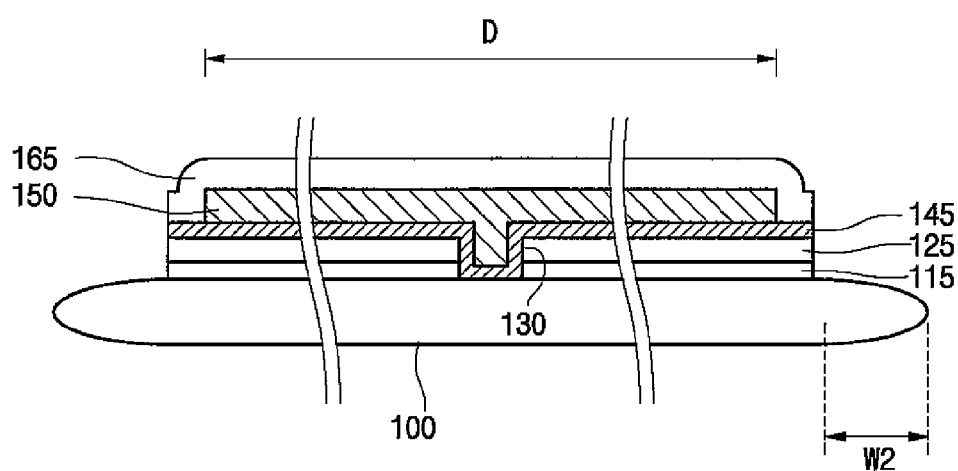
FIG. 8 is a cross-sectional view showing the second interconnection structure after applying a semiconductor wet etchant to the second interconnection forming structure of FIG. 4.

FIG. 7 is a cross-sectional view showing a first interconnection structure after applying a semiconductor wet etchant to a first interconnection forming structure of FIG. 3. FIG. 8 is a cross-sectional view showing a second interconnection structure after applying a semiconductor wet etchant to a second interconnection forming structure of FIG. 4.

Referring to FIGS. 3, 4, 7 and 8, in step S90 of FIG. 1, the semiconductor wet etchant and the protection layer may be applied to the third insulating layer 160, the second metal layer residues 155, the first metal layer 140, and the first and second insulating layers 110 and 120 until the semiconductor substrates 100 of FIGS. 3 and 4 are exposed. To this end, the semiconductor wet etchant may remove the first and second insulating layers 110 and 120 and the first metal layer 140 which correspond to an area extending by the predetermined width W2 toward the main surface from the side surface of the first interconnection forming structure 184 of FIG. 3. The semiconductor wet etchant may remove the third insulating layer 160, the first metal layer 140 and the first and second insulating layers 110 and 120 which correspond to an area extending by a predetermined width W2 toward the main surface from the side surface of the second interconnection forming structure 188 of FIG. 4. As a result, the semiconductor wet etchant may remove the second metal layer residues 155 from the semiconductor substrate 100 of FIG. 3 or 4 through the first, second and third insulating layers 110, 120 and 160, and the first metal layer 140.

While the semiconductor wet etchant is applied to the first to third insulating layers 110, 120 and 160, and the first metal layer 140 of FIGS. 3 and 4, the protection layer and the mask pattern 170 protect the second metal layer 150, which is disposed in a device-forming region D of the semiconductor substrate 100, from the semiconductor wet etchant as shown in FIG. 7. The protection layer may also protect the second metal layer 150, which is also disposed in the device-forming region D of the semiconductor substrate 100 together with the mask pattern 170 and the third insulating layer 160, from the semiconductor wet etchant as shown in FIG. 8. Thus, the semiconductor wet etchant may form a first interconnection structure 194, which includes the semiconductor substrate 100, the first and second insulating patterns 115 and 125, the first metal pattern 145 and the second metal layer 150, as shown in FIG. 7. Further, the semiconductor wet etchant may form a second interconnection structure 198, which includes the semiconductor substrate 100, the first and second insulating patterns 115 and 125, the first metal pattern 145, the second metal layer 150 and the third insulating pattern 165, as shown in FIG. 8.

After forming the first and second interconnection structures 194 and 198, in step S100 of FIG. 1, the mask pattern 170 is removed from the first or second interconnection structure 194 or 198. The mask pattern 170 may be removed using a semiconductor wet etching process having a different etch selectivity from the semiconductor substrate 100, the first to third insulating patterns 115, 125 and 165, and the first and second metal patterns 145 and 150. Subsequently, a chemical mechanical polishing technique may be applied to the first and second interconnection structures 194 and 198, thereby completing a semiconductor damascene process.

The present invention is not limited to a semiconductor wet etching process which is performed using semiconductor wet etching equipment. The present invention may be applied to a conventional semiconductor wet etching process which is performed using a different type of semiconductor wet etching equipment well known to those skilled in the art, other than a single-type one. To this end, the different type of semiconductor wet etching equipment may be a semiconductor cleaning equipment. Also, the present invention is not limited to the semiconductor wet etching process which is performed using a mask pattern. The present invention may be applied to the semiconductor wet etching process performed only using a protection layer other than the mask pattern.

As described above, the present invention is related to a semiconductor wet etchant and a method of forming an interconnection structure using the same. The semiconductor wet etchant may provide an interconnection structure having a copper concentration of 0.6E10 (atoms/cm$^2$) by easily removing insulating layers and metal layers disposed in a peripheral region of a semiconductor substrate. Accordingly, the semiconductor wet etchant may reduce metal contamination which can occur in the peripheral region of the semiconductor substrate, and thus may stabilize a process environment in the subsequent semiconductor manufacturing process for an interconnection structure.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming an interconnection structure, comprising:
    providing a semiconductor substrate having opposite main and back surfaces, and a side surface extending between the main surface to the back surface;
    forming a first insulating layer on the semiconductor substrate, wherein the first insulating layer is located over the main, back and side surfaces of the semiconductor substrate;
    forming a second insulating over the first insulating layer, wherein the second insulating layer is located over the main and side surfaces of the semiconductor substrate;
    sequentially forming first and second metal layers over second insulating layer, wherein the first metal layer is located over the main and side surfaces of the semiconductor substrate, and the second metal layer is located over the main surface of the semiconductor substrate; and
    performing a semiconductor wet etching process onto the first metal layer and the first and second insulating layers,
    wherein the semiconductor wet etching process is performed using a semiconductor wet etchant comprising a mixture of deionized water, a fluorine-based compound, an oxidizer and an inorganic salt,
    wherein a concentration of the fluorine-based compound is 0.25 to 10.0 wt % based on a total weight of the etchant, a concentration of the oxidizer is 0.45 to 3.6 wt % based on a total weight of the etchant, and a concentration of the inorganic salt is 1.0 to 5.0 wt % based on a total weight of the etchant, and
    wherein the inorganic salt comprises at least one of an ammonium ion ($NH_4^+$) and a chlorine ion ($Cl^-$).

2. The method according to claim 1, wherein the first insulating layer comprises a silicon nitride layer and the second insulating layer comprises a silicon oxide layer.

3. The method according to claim 1, wherein the first insulating layer comprises a silicon nitride layer and the second insulating layers comprises a stack of a silicon oxide layer and a silicon nitride layer.

4. The method according to claim 1, wherein the first metal layer comprises at least one of titanium (Ti), titanium nitride (TiN), tantalum (Ta) and tantalum nitride (TaN), and the second metal layer comprises copper (Cu) or a composition material comprising copper.

5. The method according to claim 1, wherein the semiconductor wet etching process comprises:
    disposing the semiconductor substrate comprising the first and second metal layers and the first and second insulating layers on a substrate chuck of a semiconductor wet etching apparatus;
    rotating the substrate chuck and the semiconductor substrate using the semiconductor wet etching apparatus;
    forming a protection layer over the main surface of the semiconductor substrate to protect the second metal layer using the semiconductor wet etching apparatus; and
    spraying the semiconductor wet etchant on the back surface and the side surface and a portion of the main surface adjacent the side surface of the semiconductor substrate to remove the first metal layer and the first and second insulating layers using the semiconductor wet etching equipment,
    wherein the protection layer includes at least one of deionized water and nitride gas.

6. The method according to claim 1, wherein the fluorine-based compound comprises at least one of fluorine hydride (HF), ammonium fluoride ($NH_4F$), ammonium bifluoride ($NH_4HF_2$), tetra-methyl ammonium fluoride (TMAF; $(CH_3)_4NF$) and tetra-butyl ammonium fluoride (TBMA; $(CH_3CH_2CH_2CH_2)_4NF$).

7. The method according to claim 1, wherein the oxidizer comprises at least one of hydrogen peroxide ($H_2O_2$), nitric acid ($HNO_3$), sulphuric acid ($H_2SO_4$), ammonium nitrate ($NH_4NO_3$), ammonium iodate ($NH_4IO_3$) and ammonium disulfate ($(NH_4)_2S_2O_5$).

8. The method according to claim 1, further the semiconductor wet etchant further comprises a non-ionic surfactant, wherein the non-ionic surfactant is a co-polymer of ethylene and propylene.

9. The method according to claim 1, wherein the first insulating layer comprises a stack of a silicon oxide layer and a silicon nitride layer in which the silicon nitride layer is an uppermost layer relative to the substrate, and wherein the second insulating layer comprises a stack of a silicon oxide layer and a silicon nitride layer.

10. The method according to claim 9, wherein the silicon oxide layer of the first insulating layer has a dielectric coefficient of 3.0 to 4.5, and the silicon oxide layer of the second insulating layer has a dielectric coefficient of 2.0 to 3.0.

11. The method according to claim 1, wherein the inorganic salt comprises a non-metal atom bonded to the ammonium ion ($NH_4^+$).

12. The method according to claim 11, wherein the non-metal atom is selected from the group consisting of chlorine (Cl), bromine (Br), Iodine (I) and carbonic acid ($CO_3$).

13. The method according to claim 1, wherein the inorganic salt comprises a metal atom bonded to the chlorine ion ($Cl^-$).

14. The method according to claim 13, wherein the metal atom is one selected from the group consisting of sodium (Na), kalium (K), calcium (Ca) and cesium (Cs).

15. The method according to claim 1, wherein the inorganic salt comprises a non-metal atom bonded to the ammonium ion ($NH_4^+$) and a metal atom bonded to the chlorine ion ($Cl^-$).

16. The method according to claim 15, wherein the non-metal atom is one selected from the group consisting of chlorine (Cl), bromine (Br), Iodine (I) and carbonic acid ($CO_3$), and the metal atom is one selected from the group consisting of sodium (Na), kalium (K), calcium (Ca) and cesium (Cs).

* * * * *